United States Patent [19]
Bauer et al.

[11] Patent Number: 5,844,844
[45] Date of Patent: Dec. 1, 1998

[54] FPGA MEMORY ELEMENT PROGRAMMABLY TRIGGERED ON BOTH CLOCK EDGES

[75] Inventors: Trevor J. Bauer, Campbell; Stephen M. Trimberger; Steven P. Young, both of San Jose, all of Calif.

[73] Assignee: Xilinx, Inc., San Jose, Calif.

[21] Appl. No.: 890,951

[22] Filed: Jul. 9, 1997

[51] Int. Cl.$^6$ .................................................. G11C 7/00
[52] U.S. Cl. ............................ 365/189.05; 365/230.08; 365/189.02
[58] Field of Search ........................... 365/189.05, 154, 365/189.02, 205, 230.08

[56] References Cited

U.S. PATENT DOCUMENTS

| | | | |
|---|---|---|---|
| 4,621,341 | 11/1986 | New | 364/900 |
| 5,572,477 | 11/1996 | Jung | 365/189.05 |
| 5,604,701 | 2/1997 | Alexander et al. | 365/189.02 |
| 5,715,198 | 2/1998 | Braceras et al. | 365/189.05 |

OTHER PUBLICATIONS

Shih–Lien Lu, "A Safe Single–Phase Clocking Scheme for CMOS Circuits", IEEE Journal of Solid–State Circuits, vol. 23, No. 1, pp. 280–283, Feb. 1988.

Neil Weste and Kamran Eshraghian, "Principles of CMOS VLSI Design, A Systems Persepective", Second Edition, Addison Wesley Publishing Company, Copyright 1993, pp. 328–329.

M. Afghahi and J. Yuan, "Double Edge–Triggered D–Flip–Flops for High Speed CMOS Circuits"; IEEE Journal of Solid State Circuits, vol. 26, No. 8, pp. 1168–1170, Aug. 1991.

Stephen H. Unger, "Double–Edge–Triggered Flip–Flops"; IEEE Transactions on Computers, vol. C–30, No. 6, pp. 447–451, Jun. 1981.

Shih–Lien Lu and Milos Ercegovac, "A Novel CMOS Implementation of Double–Edge–Triggered Flip–Flops", IEEE Journal of Solid–State Circuits, vol. 25, No. 4, pp. 1008–1010, Aug. 1990.

*Primary Examiner*—Vu A. Le
*Attorney, Agent, or Firm*—Lois D. Cartier

[57] ABSTRACT

A programmable memory element clocks in new data on both rising and falling edges of the clock, thereby optionally operating at twice the frequency of the distributed clock. The circuit according to the invention comprises two latches, one rising edge triggered and one falling edge triggered. One of these latches, each time the clock changes state, latches in a new value. When configured as a dual-edge flip-flop, the output of the inactive latch is fed forward to drive the output of the memory element. In one embodiment, the outputs of the two latches are multiplexed together and the clock selects the active output. According to a first embodiment of the invention, the memory element is used in an FPGA and can be programmed to function as either a latch or a dual-edge flip-flop. A second embodiment of the invention comprises a third latch. Based on the contents of a configuration memory cell, two of the three latches are selected to form a flip-flop. One such flip-flop is dual-edge, the other is single-edge. Further embodiments incorporate programmable variations of latches and flip-flops responsive to either or both clock edges.

30 Claims, 7 Drawing Sheets

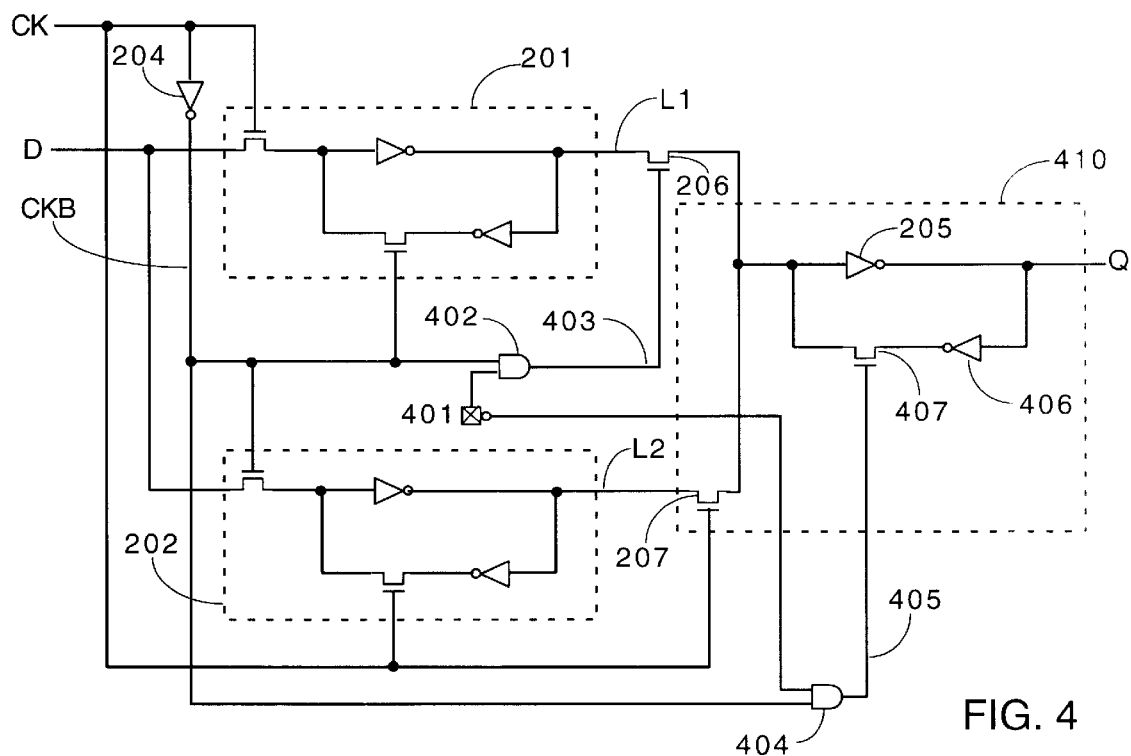
FIG. 4
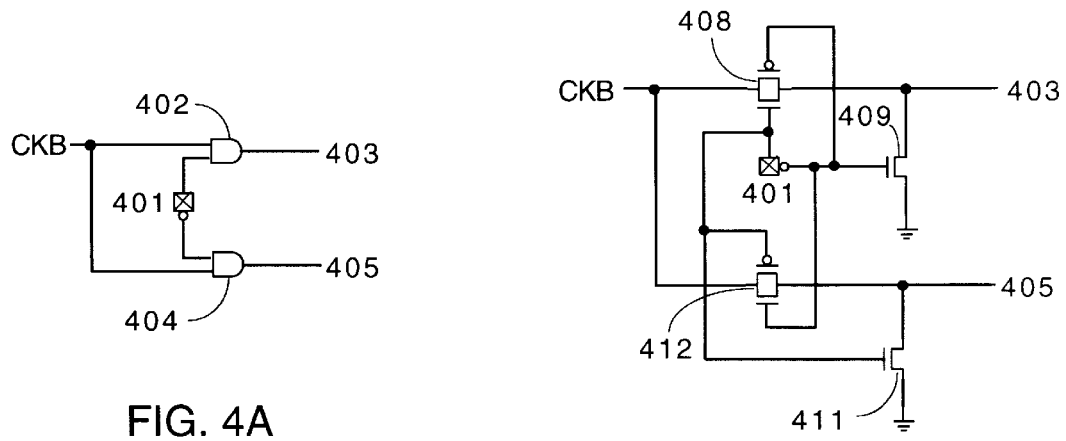
FIG. 4A
FIG. 4B

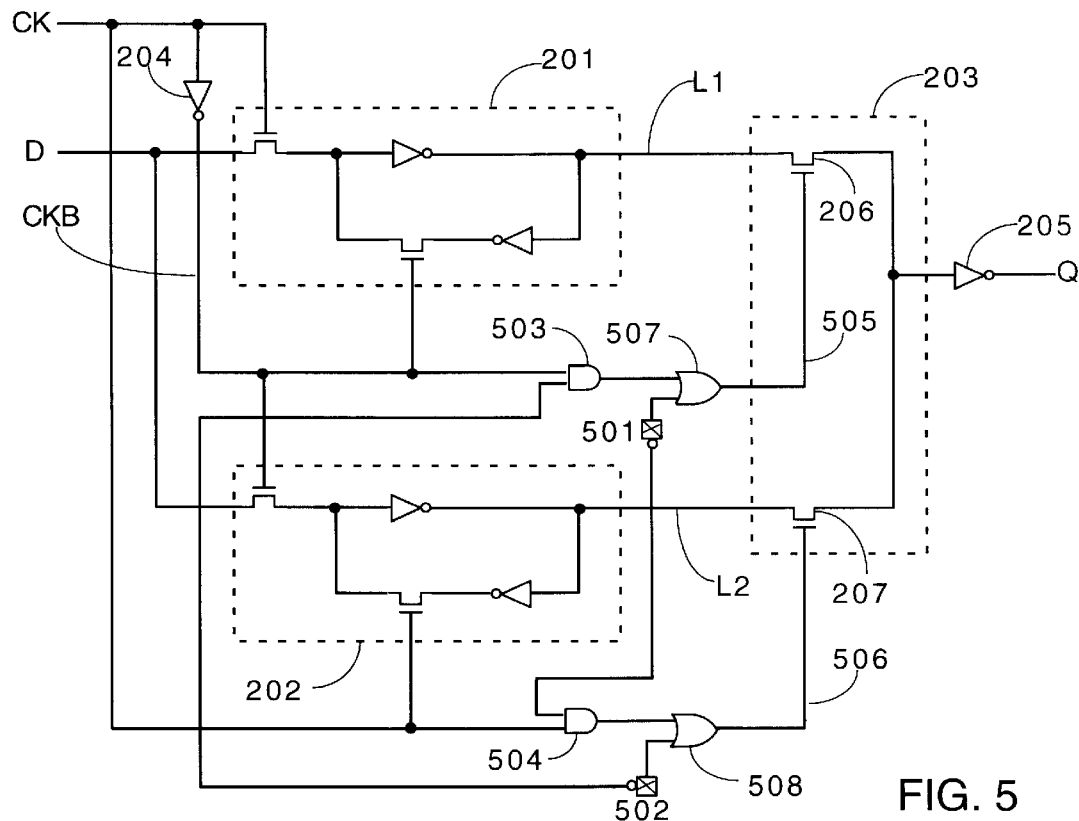
FIG. 5
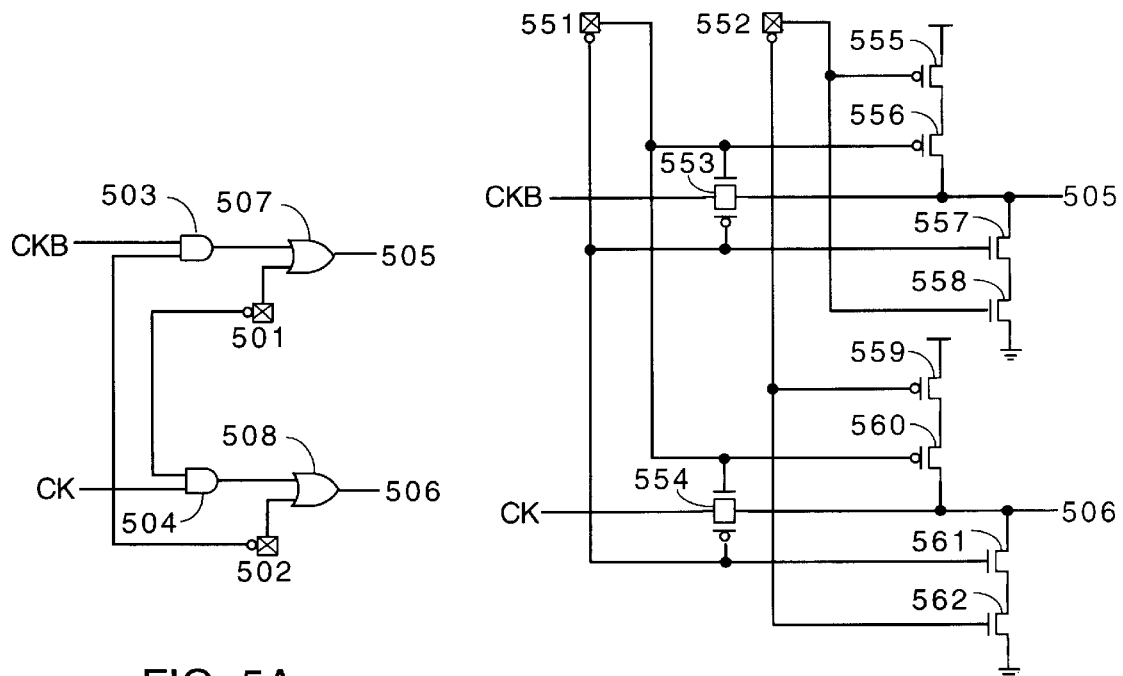
FIG. 5A
FIG. 5B

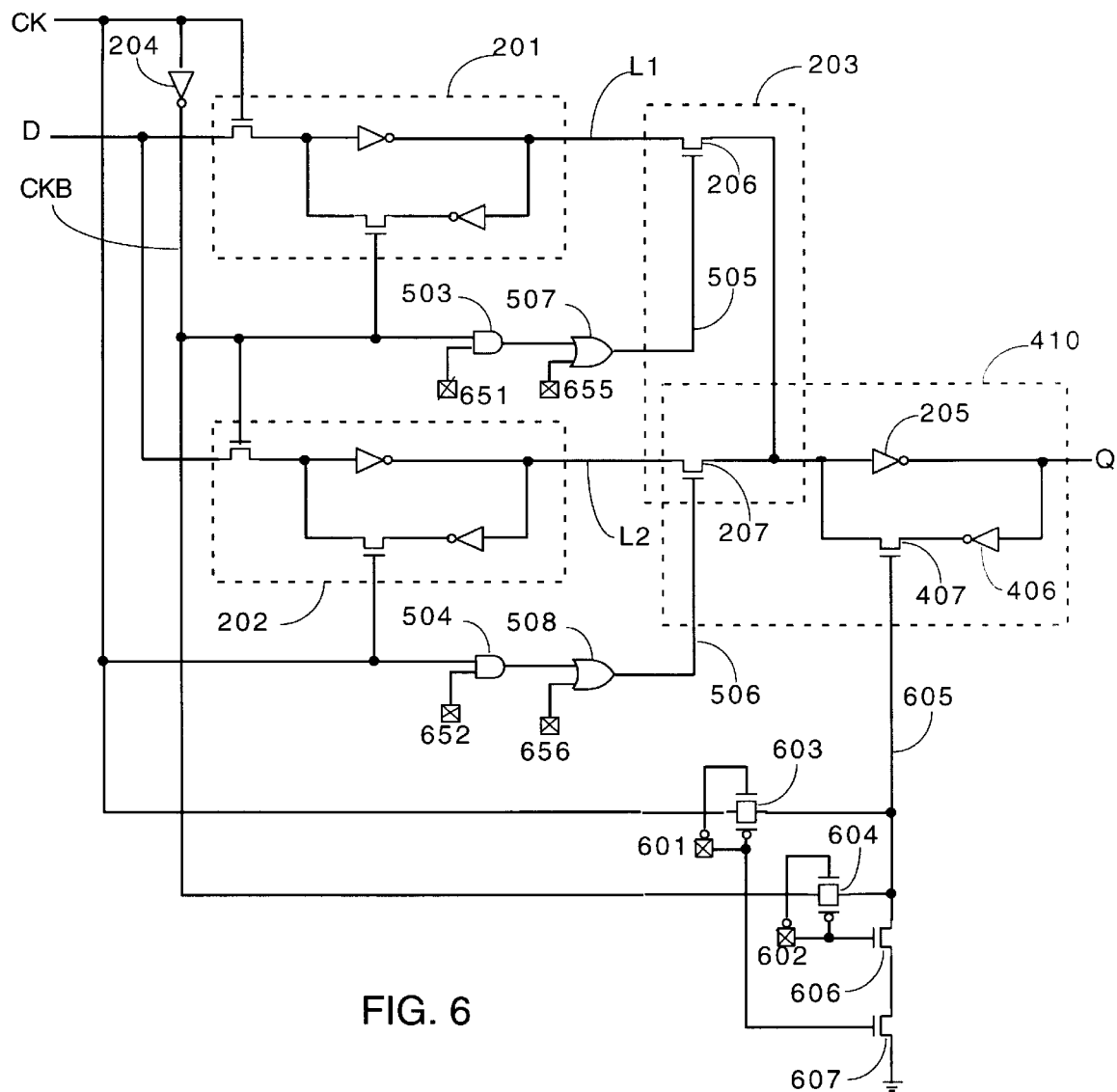
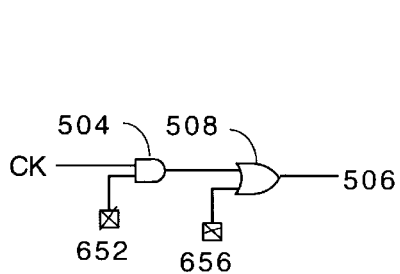
FIG. 6A
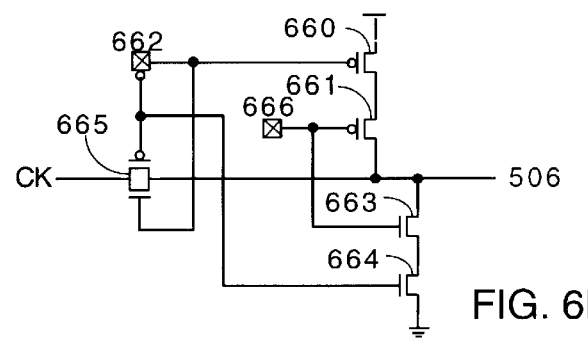
FIG. 6B
FIG. 6

FPGA MEMORY ELEMENT PROGRAMMABLY TRIGGERED ON BOTH CLOCK EDGES

CROSS-REFERENCE TO RELATED APPLICATIONS

This application relates to commonly assigned, concurrently filed U.S. patent application Ser. No. 08/890,952 invented by Bernard J. New, Trevor J. Bauer, and Steven P. Young, entitled "PROGRAMMABLE POWER REDUCTION IN A CLOCK DISTRIBUTION CIRCUIT", which is incorporated herein by reference.

BACKGROUND OF THE INVENTION

1. Field of the Invention

The invention relates to field programmable gate arrays (FPGAs). More particularly, the invention relates to a memory element for an FPGA that is programmably responsive to both clock edges.

2. Description of the Background Art

It is well known that the power dissipation of a CMOS circuit is proportional to the frequency of operation. As the clock frequency increases, the die becomes hotter, with the temperature increase at any level of power dissipation being determined by the thermal characteristics of the package. Thus, the maximum speed at which a design can operate may be limited not by the speed at which logic paths no longer have time to settle, but by the speed at which the package can no longer conduct heat away from the die fast enough to maintain a permissible temperature.

For example, without airflow the minimum package thermal resistance that can be achieved is around 10° C. per watt. (In other words, the die temperature increases 10° C. above the ambient temperature for each watt dissipated.) If the maximum ambient temperature is 50° C., and the maximum permitted die temperature is 125° C., the 75° C. temperature difference permits a maximum power dissipation of 7.5 watts.

It is to be expected that power dissipation levels equal to or greater than 7.5 watts will be commonplace in large high-performance integrated circuits (ICs). Thus, performance will be limited by power dissipation, and reducing power dissipation is of value since it will permit an IC to be operated at a higher frequency.

In particular, clock-distribution power is a concern in the design of ICs, accounting for as much as 25% of the total power dissipation. One method for reducing power dissipation by reducing the clock-distribution power is shown and described by New, Bauer, and Young in commonly assigned, concurrently filed U.S. patent application Ser. No. 08/890, 952 entitled "Programmable Power Reduction in a Clock-Distribution Circuit", which is referenced above and incorporated herein by reference. New et al describe a clock network wherein the incoming clock frequency is optionally divided by two and distributed at the new, lower frequency. This technique halves the frequency at which the clock distribution circuits operate, and consequently halves the power dissipated by the clock distribution circuits. New et al further describe the use of two edge-detectors to optionally operate a target flip-flop at twice the rate of the distributed clock. Therefore, the target flip-flop, when programmed to respond to both clock edges, operates at the same frequency as the undivided incoming clock signal.

Rising edge triggered edge-detectors operate by generating a short pulse whenever a rising clock edge is detected on the input. Falling edge triggered edge-detectors operate by generating a short pulse whenever a falling clock edge is detected on the input. The use of such pulse-generators can cause problems as IC processing techniques improve and circuits operate faster and faster over time. A race condition can occur where the generated pulse is not long enough to activate the logic it drives. Therefore, it is desirable to find an alternative circuit, not involving pulse generation, for operating a flip-flop at twice the frequency of the distributed clock.

A latch responsive to both rising and falling edges of a clock, and therefore operating at a frequency twice that of the distributed clock, is disclosed by Shih-Lien Lu and Milos Ercegovac in "A Novel CMOS Implementation of Double-Edge-Triggered Flip-Flops", IEEE Journal of Solid-State Circuits, Vol. 25, No. 4, August 1990, pages 1008–1010, which is incorporated herein by reference. Lu and Ercegovac's double-edge triggered flip-flop is shown here in FIG. 1A. (Applicant believes that the labels on each pair of latch outputs in Lu and Ercegovac's FIG. 1 are reversed, and that FIG. 1A herein shows the correctly functioning circuit.)

The circuit of FIG. 1A comprises two circuits 10 and 20 that function as clocked differential sense-amplifiers. In circuit 10, P-channel transistors 101, 103 and N-channel transistors 102, 104 form a cross-coupled latch. The cross-coupled latch is modified by N-channel transistor 109 which forms a connection between transistors 102, 104 and ground GND only when clock CK is high. Output nodes Q1B and Q1 are connected together through P-channel transistor 108 when clock CK is low. Output nodes Q1B and Q1 are further connected to node 110 through P-channel transistors 105 and 106, respectively, controlled by data D and inverse data DB, respectively. Node 110 is pulled up to positive power supply VCC through P-channel transistor 107 when clock CK is low. Circuit 20 is similar to circuit 10, but uses inverted logic.

If clock CK is low, both of circuit 10 output nodes Q1B and Q1 will be pulled high, but one of nodes Q1B and Q1 will be at a slightly higher voltage than the other. For example, if data line D is high when clock CK is low, circuit 10 output node Q1 will be pulled high through transistor 106. Circuit 10 output node Q1B will also be pulled high, through transistor 108, but not quite as high as node Q1, being reduced by one threshold voltage of transistor 108.

When clock CK goes high, circuit 10 is latched. Any voltage differential between circuit 10 output nodes Q1B and Q1 created by a voltage differential between data D and inverse data DB is amplified until one of Q1B and Q1 is high and the other is low. The value on circuit 10 output node Q1 is then fed through output multiplexer MUX to drive the double-edge latch outputs Q and QB. While clock CK remains high, the latching function of circuit 20 is deactivated, with Q2B and Q2 both held low.

When clock CK goes low, circuit 20 is latched. As in circuit 10, any voltage differential between circuit 20 output nodes Q2B and Q2 is amplified until one of Q2B and Q2 is high and the other is low. The value on circuit 20 output node Q2 is then fed through output multiplexer MUX to drive the double-edge latch outputs Q and QB. While clock CK remains low, the latching function of circuit 10 is deactivated, with Q1B and Q1 both held high.

Circuits 10 and 20 of Lu and Ercegovac's double-edge triggered flip-flop (shown in FIG. 1A) operate essentially as sense amplifiers. Therefore, this register is sensitive to noise on the Q1B, Q1, Q2B, and Q2 lines. Such sensitivity is undesirable in electronic circuits, particularly in large ICs wherein large numbers of nodes with potentially large capacitances may be changing state simultaneously. Further, Lu and Ercegovac's output multiplexer MUX may not function correctly as the positive voltages levels used in ICs are reduced from 5 volts to 3.3 volts and below, following the current trend in ICs. For example, when Q1 is low and Q1B is high, transistor pair 121 is attempting to pass a low voltage through a P-channel transistor, a technique which becomes less reliable as the positive voltage level decreases, since the threshold voltage is a greater portion of the total VCC.

It is desirable to provide a noise-insensitive flip-flop which operates at twice the frequency of the distributed clock, and which remains reliable at low voltage supply levels.

M. Afghahi and J. Yuan, in "Double Edge-Triggered D-Flip-Flops for High-Speed CMOS Circuits", IEEE Journal of Solid-State Circuits, pages 1168–1170, Vol. 26, No. 8, August 1991, which is incorporated herein by reference, suggest that a double-edge flip-flop can be constructed by using two complementary latches in parallel. One latch reacts on the rising edge of the clock, the other on the falling edge. A merging circuit is then employed to merge the two latch outputs into a single flip-flop output.

One such circuit is shown and described by Stephen H. Unger in "Double-Edge-Triggered Flip-Flops," IEEE Transactions on Computers, Vol. C-30, No. 6, pages 447–451, June 1981, which is incorporated herein by reference. Unger's flip-flop is shown herein in FIG. 1B. Latch 150 places data D on latch output node Q3 when clock signal CLOCK is high. Latch 151 places data D on latch output node Q4 when clock signal CLOCK is low. Merging circuit 152 places one of latch output nodes Q3, Q4 onto flip-flop output Q. Using latch output node Q4B as an input to NAND-gate 153 ensures a glitch-free output for Unger's double-edge flip-flop.

Another dual-edge flip-flop is shown in FIG. 2. FIG. 2 shows a dual-edge flip-flop comprising two latches and a multiplexer. Latch 201 is transparent high with respect to clock CK (i.e., latch 201 provides the D input signal to latch output node L1 when clock CK is high). Latch 202 is transparent low with respect to clock CK (i.e., latch 202 provides the D input signal to latch output node L2 when clock CK is low). when clock CK goes high, the data D is clocked into latch 201 and appears in inverted form on latch 201 output L1. However, when clock CK is high, the inverse clock CKB (driven by inverter 204) is low, and transistor 206 is off. Therefore, latch output signal L1 does not leave the dual-edge flip-flop. When clock CK is high, transistor 207 is on and the latched output L2 of latch 202 drives inventer 205, which drives output Q of the dual-edge flip-flop.

When clock CK goes low, the data D is clocked into latch 202 and appears in inverted form on latch 202 output L2. However, when clock CK is low, transistor 207 is off. Therefore, latch output signal L2 does not leave the dual-edge flip-flop. When clock CK is low, inverse clock CKB is high, transistor 206 is on and the latched output L1 of latch 201 drives inverter (or inverted buffer) 205, which drives output Q of the dual-edge flip-flop. Transistors 206, 207 function as a multiplexer 203 controlled by clock CK that selects one of latch outputs L1, L2 to drive output Q.

Therefore, new data is latched with each clock edge, and delayed by one-half clock cycle within the dual-edge flip-flop. The flip-flop of FIG. 2 therefore operates at twice the frequency of the distributed clock. This flip-flop is noise insensitive compared to a differential sense amplifier such as those included in the prior art circuit of FIG. 1A, because it responds only to a voltage change above the threshold voltage of a transistor, rather than detecting what may be a small difference between two voltage levels. This flip-flop should be no more sensitive to noise than any other digital logic in the integrated circuit (IC) or board in which the circuit is used.

Several circuits have been described that implement double-edge flip-flops. However, many designs implemented in FPGAs preferably include some circuits that operate at one frequency, and other circuits that operate at half that frequency. (One such circuit is described by New in U.S. Pat. No. 4,621,341, "Method and Apparatus for Transferring Data in Parallel From a Smaller to a Larger Register".) It would be desirable to have a programmable memory element that could assume either functionality.

SUMMARY OF THE INVENTION

According to the invention, a programmable memory element is provided that optionally clocks in new data on both rising and falling edges of the clock, thereby operating at twice the frequency of the clock. The circuit according to the invention comprises two latches, one transparent low and one transparent high. One or the other of these latches, each time the clock changes state, latches in a new value. When configured as a dual-edge flip-flop, the output of the inactive latch is fed forward to drive the output of the dual-edge flip-flop. In one embodiment, the outputs of the two latches are multiplexed together and the clock selects the active output.

According to a first embodiment of the invention, the memory element is used in a field programmable gate array (FPGA) and can be programmed to function as either a latch or a dual-edge flip-flop. Based on the contents of a configuration memory cell, one latch can be isolated from the flip-flop output while the other latch is always selected to provide the flip-flop output. Therefore, the memory element functions as a latch. When the opposite value is stored in the memory cell, the memory element is responsive to both clock edges as previously described.

A second embodiment of the invention comprises a third latch. Based on the contents of a configuration memory cell, two of the three latches are selected to form a flip-flop. One such flip-flop is dual-edge, the other is single-edge.

Further embodiments incorporate programmable variations of latches and flip-flops responsive to either or both clock edges.

BRIEF DESCRIPTION OF THE DRAWINGS

The present invention is illustrated by way of example, and not by way of limitation, in the following figures, in which like reference numerals refer to similar elements.

FIG. 4 shows a programmable memory element for an FPGA programmably configurable as either a dual-edge triggered flip-flop or a rising edge triggered flip-flop, according to a second embodiment of the invention.

FIGS. 4A and 4B show a portion of FIG. 4 and one implementation of that portion.

FIG. 5 shows a programmable memory element configurable as either a transparent high latch, a transparent low latch, or a dual-edge flip-flop, according to a third embodiment of the invention.

FIG. 5A shows a portion of FIG. 5 that can be replaced by the circuit in FIG. 5B.

FIG. 5B shows an alternative circuit that can replace the circuit of FIG. 5A in the embodiment of FIG. 5.

FIG. 6 shows a programmable memory element for an FPGA configurable as any of a dual-edge flip-flop, a rising edge flip-flop, a falling edge flip-flop, a transparent high latch, or a transparent low latch, according to a fourth embodiment of the invention.

FIG. 6A shows a portion of FIG. 6 that can be replaced by the circuit in FIG. 6B.

FIG. 6B shows an alternative circuit that can replace the circuit of FIG. 6A in the embodiment of FIG. 6.

DETAILED DESCRIPTION OF THE DRAWINGS

Several embodiments of a programmable memory element according to the invention are described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 2:
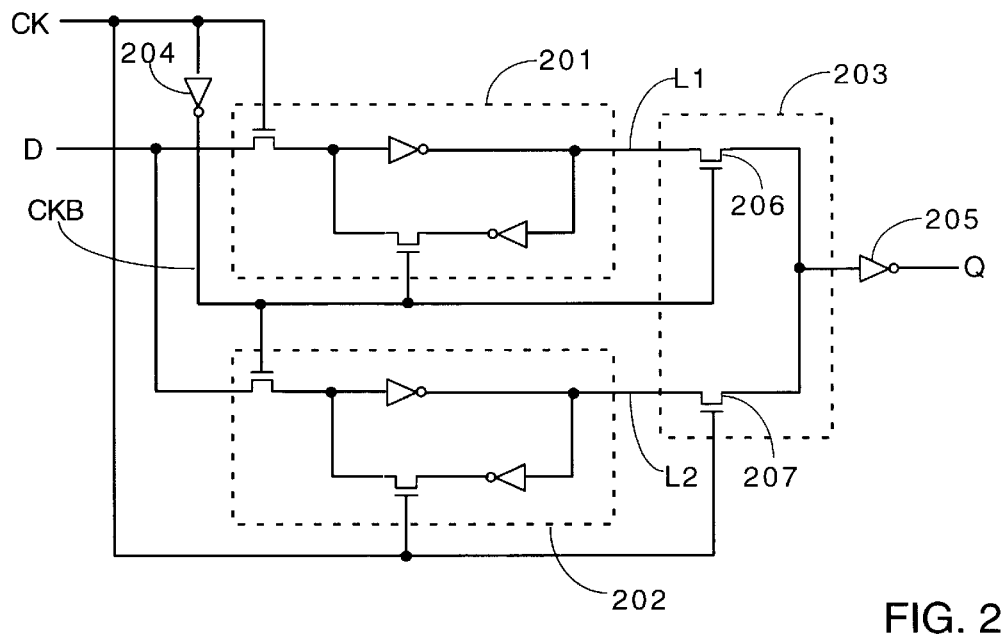
FIG. 2 shows a dual-edge flip-flop comprising two latches and a multiplexer.
Figure 3:
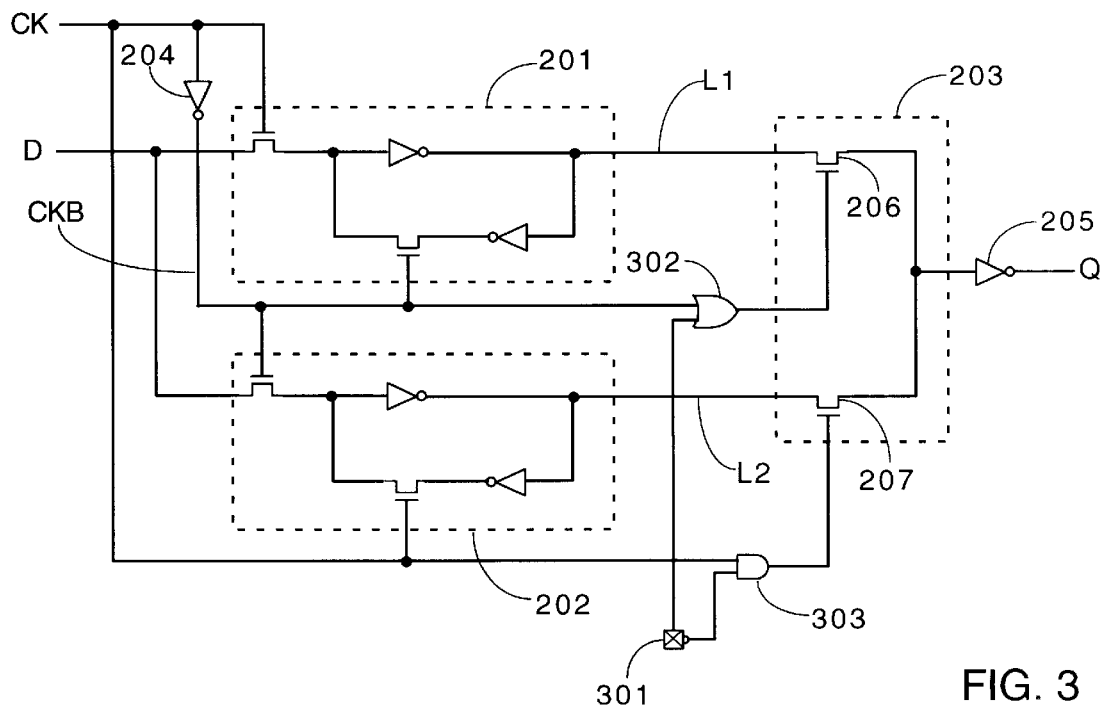
FIG. 3 shows a programmable memory element for an FPGA programmably configurable as either a dual-edge flip-flop or a transparent high latch, according to a first embodiment of the invention.

In FIG. 3, a first embodiment of the invention is shown that can be used in FPGAs. The memory element of this embodiment is programmably configurable as either a dual-edge flip-flop or a transparent high latch. In this embodiment, a memory cell 301, an OR-gate 302, and an AND-gate 303 are added to the circuit of FIG. 2, whereby the memory element of the invention can be programmably configured as either a dual-edge flip-flop or a latch. Memory cell 301 supplies both true and complement values of the bit in the memory cell. (Such memory cells are represented herein as a box with an "X" inside and a "bubble" at one edge. The line from the box represents the true value of the bit in the memory cell, the line from the bubble represents the complement value. A memory cell may be pictured without a bubble if the complement value is not used.) In this embodiment, multiplexer 203 forms part of a programmable multiplexer controlled by memory cell 301. In other embodiments, logic different from that of FIG. 3 can be added that will perform the same function. (Latches are notoriously well-known in the art and therefore are not described herein. FIG. 3 shows one common implementation of a latch; other implementations can be used.)

The embodiment of FIG. 3 can be programmed as shown in the following table (wherein MC means Memory Cell):

| Memory Element Mode | MC 301 |
| --- | --- |
| Transparent High Latch | High |
| Dual-Edge Flip-Flop | Low |

When the configuration bit stored in memory cell 301 is high, the output of OR-gate 302 is held high. Therefore, transistor 206 is on, and transparent high latch 201 is always active in that the output L1 is always used to drive output Q regardless of the state of the clock. Also, when the configuration bit stored in memory cell 301 is high, and is fed in inverted form into AND-gate 303, the output of AND-gate 303 is held low. Therefore, transistor 207 is off, and transparent low latch 202 is essentially deactivated in that the output L2 is never used to drive output Q regardless of the state of the clock.

When the configuration bit stored in memory cell 301 is low, both OR-gate 302 and AND-gate 303 are transparent, and the programmable memory element operates in the same fashion as the dual-edge flip-flop of FIG. 2.

Figure 1A:
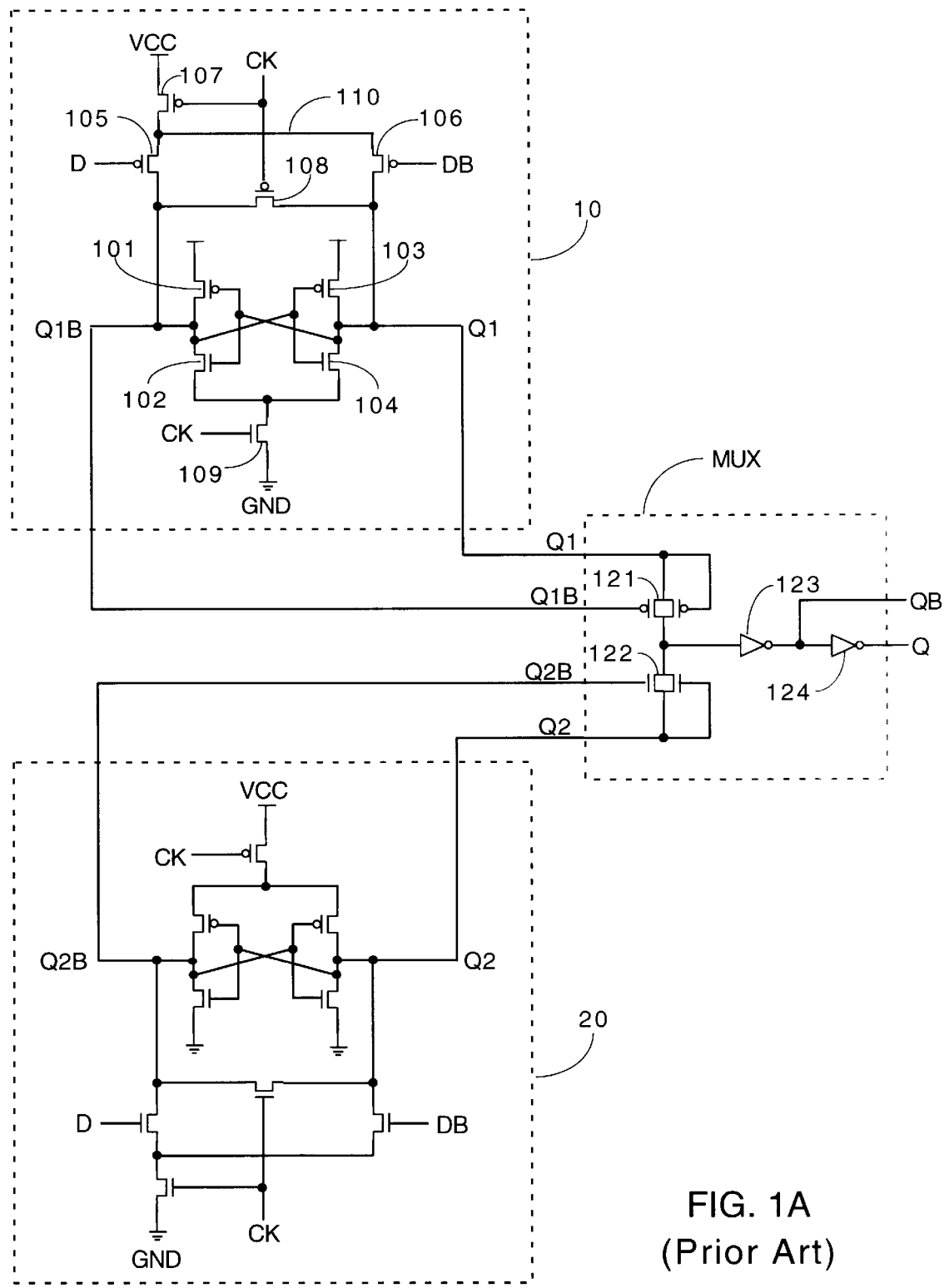
FIG. 1A shows a prior art latch responsive to both clock edges.
Figure 1B:
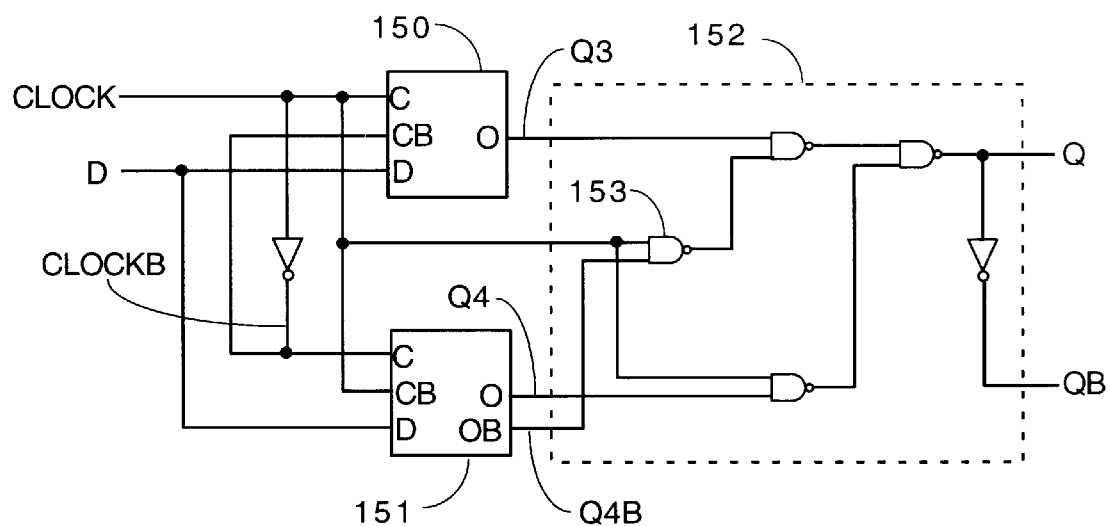
FIG. 1B shows a prior art double-edge flip-flop comprising two latches and a merging circuit.

Note that many different circuits can be used in the embodiment of FIG. 3. For example, Unger's glitch-free merging circuit (multiplexer) 152 of the present FIG. 1B could be substituted for multiplexer 203 and inverter 205.

FIG. 4 shows a second embodiment of the invention, wherein the programmable memory element can be configured as either a dual-edge or a rising-edge flip-flop. Inverter 406 and transistor 407 form a feedback loop on the output. Thus, inverters 205, 406 and transistors 407, 207 form a third latch 410 (in addition to latches 201 and 202), which is transparent high with respect to clock CK. AND-gates 402, 404 are also added to the circuit. The memory element of this embodiment may be formed as part of an FPGA and controlled by FPGA configuration memory cell 401, which supplies both true and complement values of the bit in the memory cell. The true value controls AND-gate 402; the complement value controls AND-gate 404.

The embodiment of FIG. 4 can be programmed as shown in the following table:

| Memory Element Mode | MC 401 | Node 403 | Node 405 |
| --- | --- | --- | --- |
| Dual-Edge Flip-Flop | High | CKB | Low |
| Rising-Edge Flip-Flop | Low | Low | CKB |

Looking at FIG. 4, it is clear that when the value in memory cell 401 is high, transistor 206 is controlled by the value on inverse clock CKB, while the output of AND-gate 404 is low and transistor 407 is off. Therefore, when the value in memory cell 401 is high, the memory element of FIG. 4 behaves the same as the dual-edge flip-flop of FIG. 2.

However, when the value in memory cell 401 is low, the output of AND-gate 402 is low, transistor 206 is turned off, and latch 201 does not contribute to output Q. At the same time, transistor 407 is controlled by the value on clock CKB, and transparent low latch 202 works in concert with transparent high latch 410 to create a rising edge triggered flip-flop.

FIG. 4A shows a portion of FIG. 4 that can be implemented as shown in FIG. 4B. FIG. 4B shows an implementation of AND-gates 402 and 404, an implementation requiring only three transistors per AND-gate. Transmission gate 408 and transistor 409 implement AND-gate 402. Transmission gate 412 and transistor 411 implement AND-gate 404.

FIG. 5 shows a third embodiment of the invention for use in an FPGA. The programmable memory element of this embodiment can be configured as either a transparent high latch, a transparent low latch, or a dual-edge flip-flop. The double-edge flip-flop of FIG. 2 has been modified in FIG. 5 by the addition of two memory cells 501, 502, two AND-gates 503, 504, and two OR-gates 507, 508 controlling multiplexer 203.

The embodiment of FIG. 5 can be programmed as shown in the following table (wherein ME means Memory Element, T means Transparent, and FF means Flip-Flop):

| ME Mode | MC 501 | MC 502 | Node 505 | Node 506 |
| --- | --- | --- | --- | --- |
| T-High Latch | High | Low | High | Low |
| T-Low Latch | Low | High | Low | High |
| Dual-Edge FF | Low | Low | CKB | CK |
| Not Supported | High | High | High | High |

To configure the circuit of FIG. 5 as a transparent high latch, the configuration bit in memory cell 501 is made high and the configuration bit in memory cell 502 is made low (so transistor 206 is on and transistor 207 is off). To configure the same circuit as a transparent low latch, the configuration bit in memory cell 502 is high and the configuration bit in memory cell 501 is low (so transistor 207 is on and transistor 206 is off). To configure the embodiment of FIG. 5 as a dual-edge flip-flop, the configuration bits in memory cells 501 and 502 are both low. Clearly, some combinations of memory cell values must not be used. For example, setting both of memory cells 501, 502 high in the embodiment of FIG. 5 would turn on both of transistors 206, 207, which would cause contention on the input of inverter 205.

FIG. 5A shows a portion of FIG. 5 that can be replaced by the circuit of FIG. 5B. FIG. 5B shows an alternative implementation of the control circuit for transistors 206 and 207. The circuit in FIG. 5B does not behave the same as the circuit of FIG. 5A, as shown in the following table:

| ME Mode | MC 551 | MC 552 | Node 505 | Node 506 |
| --- | --- | --- | --- | --- |
| Dual-Edge FF | High | Low | CKB | CK |
| T-Low Latch | Low | High | Low | High |
| T-High Latch | Low | Low | High | Low |
| Dual-Edge FF | High | High | CKB | CK |

For example, in FIG. 5A, a high value in both of memory cells 501, 502 drives both of nodes 505, 506 high. In the circuit of FIG. 5B, a high value in both of memory cells 551, 552 turns on both of transmission gates 553, 554, placing the value of CKB on node 505 and the value of CK on node 506. However, this example makes it clear that different circuits, not having the same memory cell programming pattern, can be used to implement the invention. Other circuits can also be used, requiring different memory cell values or different numbers of memory cells, provided that the desired functions are made available.

The implementation shown in FIG. 5B has the advantage that when signal CKB is passed through to node 505, and when signal CK is passed through to node 506, there is only one transmission gate in the path. This delay minimization can be important in reducing the possibility of a race condition on the paths between the CK input to latch 201 and node 505 controlling gate 206, and between the CKB input to latch 202 and node 506 controlling gate 207. It is important that gate 206 is off before latch 201 becomes transparent, and that gate 207 is off before latch 202 becomes transparent. Delay elements may be required on the CK and CKB latch inputs to ensure that the flip-flop functions correctly.

The programmable memory element of FIG. 6 combines all of the features offered in the embodiments of FIGS. 3–5, and offers the additional capability of configuration as a falling edge flip-flop. To the memory element of FIG. 5 (configurable as dual-edge flip-flop, transparent high, and transparent low latches) is added the third latch 410 of FIG. 4. Six memory cells are provided (651, 652, 655, 656, 601, 602).

The embodiment of FIG. 6 can be programmed as shown in the following table (wherein "X" means Any Value):

| ME Mode | MC 651 | MC 655 | Node 505 |
| --- | --- | --- | --- |
| T-Low Latch | Low | Low | Low |
| T-High Latch | X | High | High |
| Dual-Edge FF | High | Low | CKB |
| Rising-Edge FF | Low | Low | Low |
| Falling-Edge FF | High | Low | CKB |

| ME Mode | MC 652 | MC 656 | Node 506 |
| --- | --- | --- | --- |
| T-Low Latch | X | High | High |
| T-High Latch | Low | Low | Low |
| Dual-Edge FF | High | Low | CK |
| Rising-Edge FF | High | Low | CK |
| Falling-Edge FF | Low | Low | Low |

| ME Mode | MC 601 | MC 602 | Node 605 |
| --- | --- | --- | --- |
| T-Low Latch | High | High | Low |
| T-High Latch | High | High | Low |
| Dual-Edge FF | High | High | Low |
| Rising-Edge FF | High | Low | CKB |
| Falling-Edge FF | Low | High | CK |
| Not Supported | Low | Low | Contention |

Looking at FIG. 6, it is seen that to configure the memory element as a transparent high or low latch, or as a dual-edge flip-flop as in FIG. 2, transistor 407 must be off (i.e., latch 410 is not used). To configure the memory element as a rising edge flip-flop, latches 202 and 410 must be used and transistor 407 must be controlled by the value of inverse clock CKB. To configure the memory element as a falling edge flip-flop, latches 201 and 410 must be used and transistor 407 must be controlled by the value of clock CK. Therefore, node 605 must be configurable to be low, to follow CKB, and to follow CK.

To force node 605 low, the configuration bits in memory cells 601, 602 are both set high. Thus, transmission gates 603, 604 are both off and transistors 606, 607 are both on, so node 605 is pulled low. To pass the value on clock CK through transmission gate 603 to node 605, the configuration bit in memory cell 601 is set low and the configuration bit in memory cell 602 is set high. To pass the value on clock CKB through transmission gate 604 to node 605, the configuration bit in memory cell 602 is set low and the configuration bit in memory cell 601 is set high. Memory cells 601 and 602 should not both be set low.

FIG. 6A shows a portion of FIG. 6 that can be replaced by the circuit of FIG. 6B. FIG. 6B shows an alternative implementation of the control circuit for transistor 207. The circuit in FIG. 6B does not have the same truth table as the circuit of FIG. 6A, as shown in the following table:

| ME Mode | MC 662 | MC 666 | Node 506 |
|---|---|---|---|
| T-Low Latch | Low | Low | High |
| T-High Latch | Low | High | Low |
| Dual-Edge FF | High | X | CK |
| Rising-Edge FF | High | X | CK |
| Falling-Edge FF | Low | High | Low |

A comparison with memory cells 652, 656 in the previous table shows many differences. However, either of these circuits, or yet another circuit, can be used to implement this embodiment of the invention. AND-gate 503, OR-gate 507, and memory cells 651, 655 can also be replaced by the same or a different circuit.

Figure 6C:
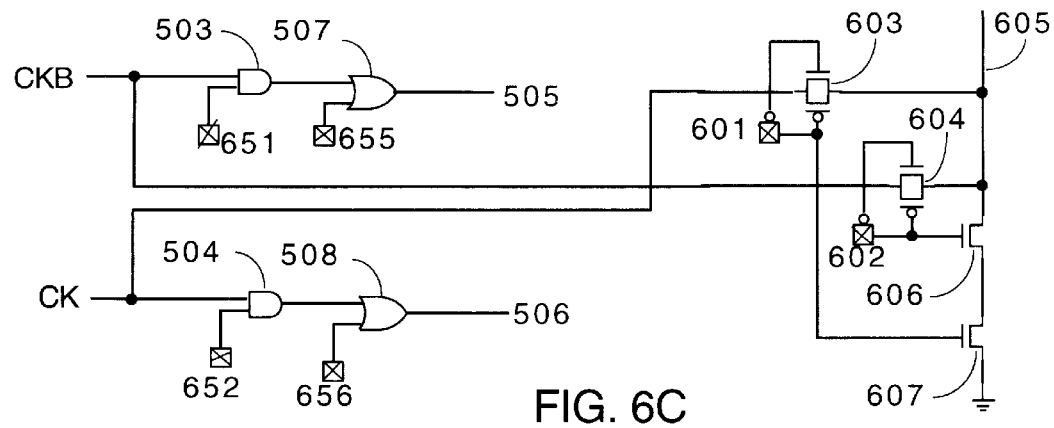
FIG. 6C shows a portion of FIG. 6 that can be replaced by the circuit in FIG. 6D.
Figure 6D:
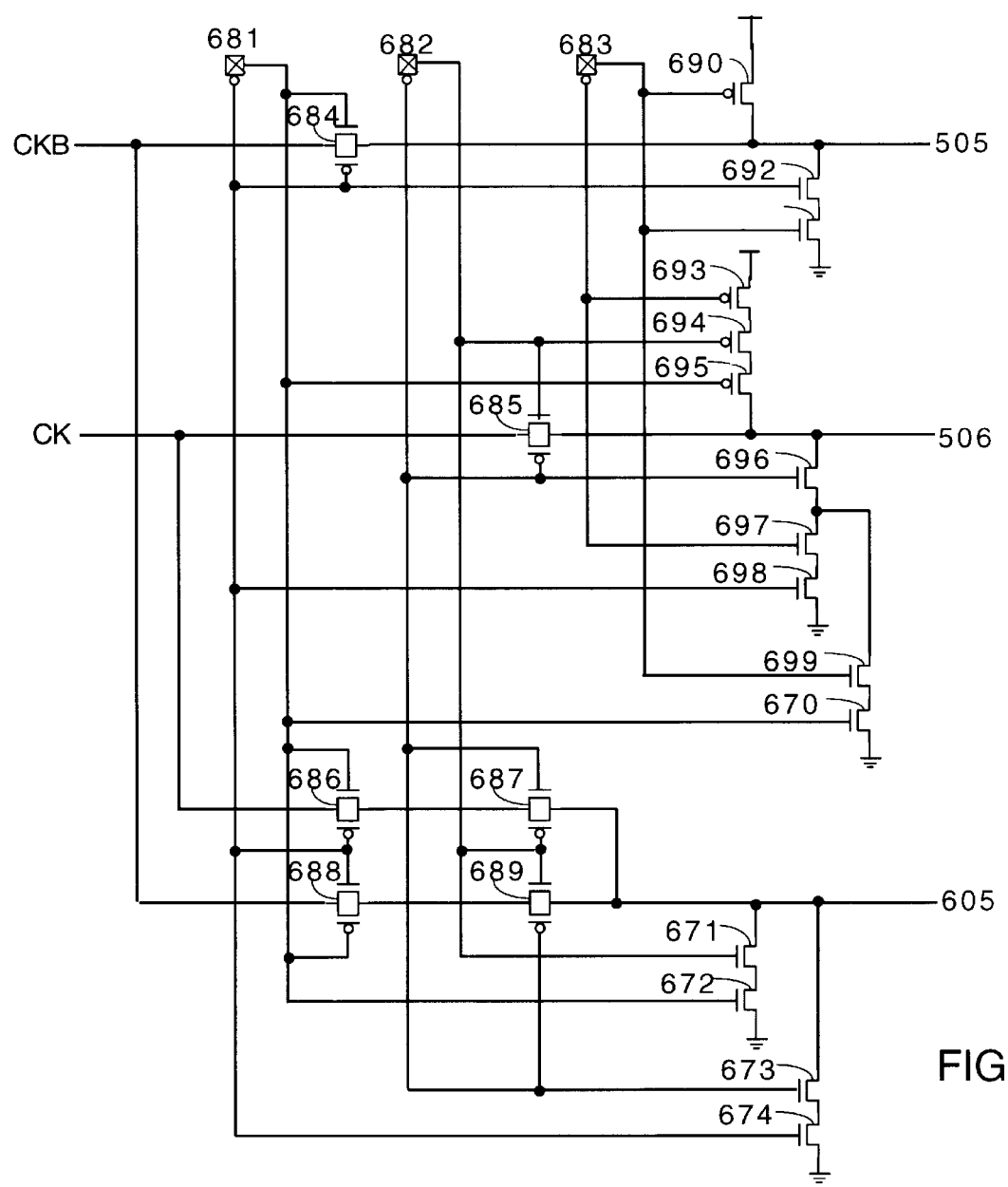
FIG. 6D shows an alternative circuit that can replace the circuit of FIG. 6C in the embodiment of FIG. 6.

FIG. 6C shows a portion of FIG. 6 that can be replaced by the circuit of FIG. 6D. FIG. 6D shows an alternative implementation of the control circuits for transistors 206, 207, and 407. The circuit of FIG. 6D can be programmed as shown in the following table:

| ME Mode | MC 681 | MC 682 | MC 683 | Node 505 |
|---|---|---|---|---|
| T-Low Latch | Low | Low | High | Low |
| T-High Latch | Low | Low | Low | High |
| Dual-Edge FF | High | High | High | CKB |
| Rising-Edge FF | Low | High | High | Low |
| Falling-Edge FF | High | Low | High | CKB |

| ME Mode | MC 681 | MC 682 | MC 683 | Node 506 |
|---|---|---|---|---|
| T-Low Latch | Low | Low | High | High |
| T-High Latch | Low | Low | Low | Low |
| Dual-Edge FF | High | High | High | CK |
| Rising-Edge FF | Low | High | High | CK |
| Falling-Edge FF | High | Low | High | Low |

| ME Mode | MC 681 | MC 682 | MC 683 | Node 605 |
|---|---|---|---|---|
| T-Low Latch | Low | Low | High | Low |
| T-High Latch | Low | Low | Low | Low |
| Dual-Edge FF | High | High | High | Low |
| Rising-Edge FF | Low | High | High | CKB |
| Falling-Edge FF | High | Low | High | CK |

Although the implementation of FIG. 6D appears to have more elements than the implementation of FIG. 6C, the FIG. 6D implementation has only three memory cells (681, 682, 683) while the FIG. 6C implementation has six memory cells (651, 652, 655, 656, 601, 602). Implementing configuration memory cells requires a significant amount of silicon area, so the implementation of FIG. 6D may be preferred. Another advantage to the implementation of FIG. 6D is that fewer memory cells require a shorter configuration time.

All single gates in FIG. 6D (i.e., all gates except transmission gates 684, 685, 686, 687, 688, and 689) can be of minimum size, since they are passing a static voltage once the memory cells (681, 682, 683) have been programmed.

It has been demonstrated that the memory element of the present invention offers a relatively noise insensitive flip-flop that will programmably operate at twice the frequency of the distributed clock. The circuit of the invention is also reliable at low voltages, as earlier described. Further, the novel use of programmable latches to form the memory element enables its use in FPGAs to function as either a latch or a flip-flop responsive to either or both clock edges. Yet further, the inputs and outputs of the programmable memory element of the invention correspond to those of existing single-edge flip-flops. Therefore, the circuit of the invention can be used to replace flip-flops in some existing designs with little or no modification to the designs, resulting in up to a two-fold increase in operating frequency. Alternatively, reducing the clock frequency by half (thereby leaving the operating frequency the same as before the substitution) may result in some cases in a significant decrease in power dissipation due to the lower frequency of the distributed clock.

The programmable memory element of the invention is described herein in the context of FPGAs. However, the invention can also be applied to other programmable ICs. (The term "programmable ICs" as used herein includes but is not limited to FPGAs, mask programmable devices such as Application Specific ICs (ASICs), Programmable Logic Devices (PLDs), and devices in which only a portion of the logic is programmable.)

FIGS. 3–6D show only a few of the many different embodiments of the invention that can be implemented. For example, the memory element can have synchronous or asynchronous set/reset capability. Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. A programmable memory element having an output capable of changing on both rising and falling clock edges, comprising:

a transparent low latch;

a transparent high latch;

programmable means for causing said transparent low latch to drive the memory element output during a first clock level and said transparent high latch to drive the memory element output during a second clock level.

2. The programmable memory element of claim 1, wherein said programmable means for causing said transparent low latch to drive the memory element output during a first clock level and said transparent high latch to drive the memory element output during a second clock level comprises a programmable multiplexer.

3. The programmable memory element of claim 1, further comprising:

means for programmably configuring the memory element as a latch.

4. The programmable memory element of claim 3, wherein said means for programmably configuring the memory element as a latch comprises a configuration memory cell.

5. The programmable memory element of claim 1, further comprising:

means for programmably configuring the memory element as a transparent low latch; and means for programmably configuring the memory element as a transparent high latch.

6. The programmable memory element of claim 1, further comprising:

means for programmably configuring the memory element as a rising edge triggered flip-flop.

7. The programmable memory element of claim 1, further comprising:

means for programmably configuring the memory element as a falling edge triggered flip-flop.

8. The programmable memory element of claim 1, further comprising:

means for programmably configuring the memory element as a rising edge triggered flip-flop; and means for programmably configuring the memory element as a falling edge triggered flip-flop.

9. A programmable memory element, comprising:

an input line;

an output line;

a clock line;

a first latch for latching data on said input line in response to a rising edge on said clock line, said first latch having an output;

a second latch for latching data on said input line in response to a falling edge on said clock line, said second latch having an output;

programmable means for selecting between said outputs of said first and second latches and placing said selected latch output on said output line.

10. The programmable memory element of claim 9, wherein said programmable means for selecting between said outputs of said first and second latches and placing said selected latch output on said output line comprises a programmable multiplexer controlled by said clock line.

11. The programmable memory element of claim 9, further comprising:

means for programmably configuring the memory element as a latch.

12. The programmable memory element of claim 11, wherein said means for programmably configuring the memory element as a latch comprises a configuration memory cell.

13. The programmable memory element of claim 9, further comprising:

means for programmably configuring the memory element as a transparent low latch; and means for programmably configuring the memory element as a transparent high latch.

14. The programmable memory element of claim 9, further comprising:

means for programmably configuring the memory element as a rising edge triggered flip-flop.

15. The programmable memory element of claim 9, further comprising:

means for programmably configuring the memory element as a falling edge triggered flip-flop.

16. The programmable memory element of claim 9, further comprising:

means for programmably configuring the memory element as a rising edge triggered flip-flop; and means for programmably configuring the memory element as a falling edge triggered flip-flop.

17. A programmable memory element, comprising:

an input line;

an output line;

a clock line;

a first latch for latching data on said input line in response to a rising edge on said clock line, said first latch having an output;

a second latch for latching data on said input line in response to a falling edge on said clock line, said second latch having an output;

programmable means for selecting between said outputs of said first and second latches; and means for placing said selected latch output on said output line.

18. The programmable memory element of claim 17, wherein said programmable means for selecting between said outputs of said first and second latches comprises a programmable multiplexer controlled by said clock line.

19. The programmable memory element of claim 17, wherein said means for placing said selected latch output on said output line comprises an inverter.

20. The programmable memory element of claim 17, wherein said means for placing said selected latch output on said output line comprises a buffer.

21. The programmable memory element of claim 17, further comprising:

means for programmably configuring the memory element as a latch.

22. The programmable memory element of claim 21, wherein said means for programmably configuring the memory element as a latch comprises a configuration memory cell.

23. The programmable memory element of claim 17, further comprising:

means for programmably configuring the memory element as a transparent low latch; and means for programmably configuring the memory element as a transparent high latch.

24. A programmable memory element, comprising:

an input line;

an output line;

a clock line;

a first latch for latching data on said input line in response to a rising edge on said clock line, said first latch having an output;

a second latch for latching data on said input line in response to a falling edge on said clock line, said second latch having an output;

a programmable multiplexer controlled by said clock line for selecting between said outputs of said first and second latches and placing said selected latch output on said output line.

25. The programmable memory element of claim 24, further comprising:

means for programmably configuring said memory element as a transparent low latch; and means for programmably configuring said memory element as a transparent high latch.

26. The programmable memory element of claim 24, further comprising:

a configurable memory cell for configuring said memory element as a transparent low latch; and a configurable memory cell for configuring said memory element as a transparent high latch.

27. A programmable memory element, comprising:

an input line;

an output line;

a clock line;

a first latch for latching data on said input line in response to a rising edge on said clock line, said first latch having an output;

a second latch for latching data on said input line in response to a falling edge on said clock line, said second latch having an output;

a programmable multiplexer controlled by said clock line for selecting between said outputs of said first and second latches, said multiplexer having an output;

a third latch for programmably latching said output of said multiplexer, said third latch having an output which drives said output line; and means for programmably configuring the memory element as a single-edge flip-flop.

28. The programmable memory element of claim 27, further comprising:

means for programmably configuring the memory element as a rising edge flip-flop; and means for programmably configuring the memory element as a falling edge flip-flop.

29. The programmable memory element of claim 27, further comprising:

means for programmably configuring the memory element as a latch.

30. The programmable memory element of claim 27, further comprising:

means for programmably configuring the memory element as a transparent high latch; and means for programmably configuring the memory element as a transparent low latch.

\* \* \* \* \*